United States Patent [19]

Hshieh et al.

[11] Patent Number: 5,404,040
[45] Date of Patent: Apr. 4, 1995

[54] STRUCTURE AND FABRICATION OF POWER MOSFETS, INCLUDING TERMINATION STRUCTURES

[75] Inventors: Fwu-Iuan Hshieh, San Jose; Mike Chang, Cupertino; Jun W. Chen, Saratoga; King Owyang, Atherton; Dorman C. Pitzer, San Ramon; Jan V. D. Linde, Saratoga, all of Calif.

[73] Assignee: Siliconix incorporated, Santa Clara, Calif.

[21] Appl. No.: 96,135

[22] Filed: Jul. 22, 1993

Related U.S. Application Data

[63] Continuation-in-part of Ser. No. 881,589, May 12, 1992, Pat. No. 5,304,831, which is a continuation-in-part of Ser. No. 631,573, Dec. 21, 1990, abandoned.

[51] Int. Cl.$^6$ .................... H01L 29/68; H01L 21/265
[52] U.S. Cl. .................... 257/341; 257/377; 257/382; 257/401; 257/412; 257/620; 257/754; 257/773; 437/40; 437/49; 437/186; 437/189; 437/228; 437/233; 437/913
[58] Field of Search ............... 257/341, 377, 382, 401, 257/412, 620, 754, 773; 437/40, 49, 186, 189, 228, 233, 913

[56] References Cited

U.S. PATENT DOCUMENTS

| | | | |
|---|---|---|---|
| 4,399,449 | 8/1983 | Herman et al. | |
| 4,532,534 | 7/1985 | Ford et al. | |
| 4,593,302 | 6/1986 | Lidow et al. | |
| 4,646,117 | 2/1987 | Temple | 257/341 |
| 4,680,853 | 7/1987 | Lidow et al. | 257/341 |
| 4,819,044 | 4/1989 | Murakami | |
| 4,974,059 | 11/1990 | Kinzer | |
| 4,982,249 | 1/1991 | Kim et al. | |
| 5,016,066 | 5/1991 | Takahashi | |

FOREIGN PATENT DOCUMENTS

| | | |
|---|---|---|
| 60-249367 | 12/1985 | Japan. |
| 61-80860 | 4/1986 | Japan. |
| 3-273180 | 7/1991 | Japan. |
| 2033658 | 5/1980 | United Kingdom. |
| 2137811 | 10/1984 | United Kingdom. |
| 2166290 | 4/1986 | United Kingdom. |

OTHER PUBLICATIONS

Antognetti, *Power Imtegrated Circuits: Physics, Design, and Applications* (McGraw-Hill Book Co.), 1986, pp. 3.14-3.27 Dec.

Baliga, *Modern Power Devices* (Wiley-Interscience), 1987, pp. 62-131 Dec.

"SMP60N06, 60N05, SMP50N06, 50N05, N-Channel Enhancement Mode Transistors," MOSPOWER Data Book, Siliconix inc., 1988, pp. 4-423-4-426 Dec.

*Primary Examiner*—Edward Wojciechowicz
*Attorney, Agent, or Firm*—Skjerven, Morrill, MacPherson, Franklin & Friel; Ronald J. Meetin

[57] ABSTRACT

A power MOSFET is created from a semiconductor body (2000 and 2001) having a main active area and a peripheral termination area. A first insulating layer (2002) of substantially uniform thickness lies over the active and termination areas. A main polycrystalline portion (2003A/2003B) lies over the first insulating layer largely above the active area. First and second peripheral polycrystalline segments (2003C1 and 2003C2) lie over the first insulating layer above the termination area.

A gate electrode (2016) contacts the main polycrystalline portion. A source electrode (2015A/2015B) contacts the active area, the termination area, and the first polycrystalline segment. An optional additional metal portion (2019) contacts the second polycrystalline segment. The MOSFET is typically created by a five-mask process. A defreckle etch is performed subsequent to metal deposition and patterning to define the two peripheral polycrystalline segments.

31 Claims, 10 Drawing Sheets

STRUCTURE AND FABRICATION OF POWER MOSFETS, INCLUDING TERMINATION STRUCTURES

CROSS-REFERENCE TO RELATED APPLICATIONS

This is a continuation-in-part of U.S. patent application Ser. No. 7/881,589, filed 12 May 1992, now U.S. Pat. No. 5,304,831, issued Apr. 19, 1994, which is a continuation-in-part of U.S. patent application Ser. No. 07/631,573, filed 21 Dec. 1990, now abandoned.

FIELD OF THE INVENTION

This invention relates to the structure and fabrication of semiconductor devices and, more particularly, to power MOSFETs and associated termination structures.

DESCRIPTION OF RELATED ART

Figure 1:
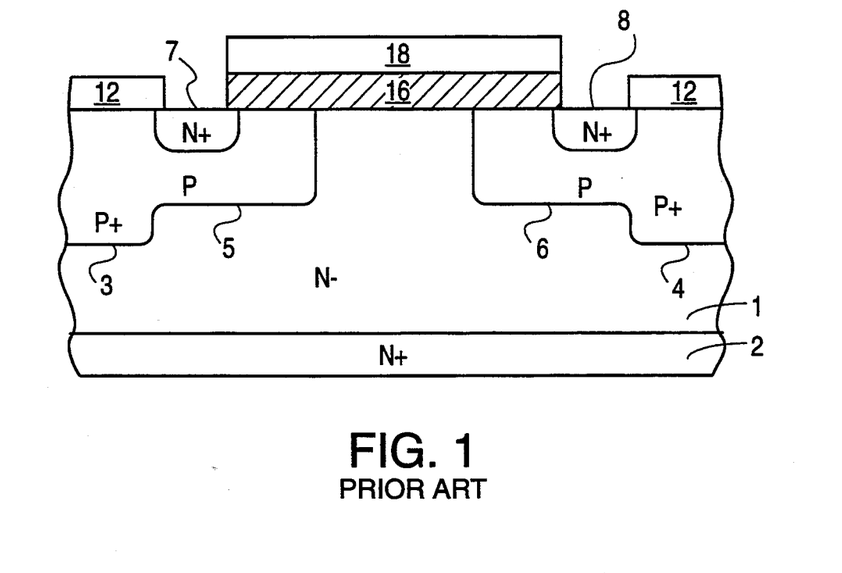
FIG. 1 is a cross-sectional structural view of a general N-channel power MOSFET.

Power MOSFET devices are employed in applications such as automobile electrical systems, power supplies, and power management applications. FIG. 1 illustrates a typical structure for an N-channel power MOSFET. An N-epitaxial silicon layer 1 formed over an N+silicon substrate 2 contains deep P+regions 3 and 4, P body regions 5 and 6, and N+source regions 7 and 8 for two MOSFET cells in the device. A continuous source-body electrode 12 extends across certain surface portions of epitaxial layer 1.

The N-type drain for both cells is formed by the portion of N−epitaxial layer 1 extending to the upper semiconductor surface in FIG. 1. A drain electrode (not separately shown) is provided at the bottom of N+substrate 2. An insulated gate structure comprising gate oxide 16 and gate polysilicon 18 lies over the channel and drain portions of the body.

Many different processes have been used to fabricate power MOSFET devices. These fabrication processes generally employ deep diffusion. For example, in a process disclosed in Lidlow et al, UK Patent Publication 2,033,658A, a deep P-type region is about 4 $\mu$m deep, and a P-type body region is about 3 $\mu$m deep.

A commercially available power MOSFET is the SMP60N05 product made by Siliconix, Inc. The SMP60N05 device has a specific on-resistance of 3.5 milliohms/cm$^2$. The technology used to fabricate the SMP60N05 product typically achieves junction depths of 2.5–5.0 $\mu$m for the P body region, 5.0–6.0 $\mu$m for the P+body contact zone, and 0.5–1.0 $\mu$m for the N+source regions.

SUMMARY OF THE INVENTION

The present invention furnishes a unique termination structure for a power MOSFET created from a monocrystalline semiconductor body divided into a main active area and a peripheral termination area.

In a first aspect of the invention, a first insulating layer of substantially uniform thickness overlies the active and termination areas. The thickness of the first insulating layer preferably is 100–1000 angstroms. The first insulating layer constitutes the gate dielectric for the power MOSFET.

A peripheral polycrystalline semiconductor segment is situated over the first insulating layer above the termination area. A second insulating layer overlies the peripheral polycrystalline segment. A source electrode for the MOSFET contacts the active area through a plurality of openings in the insulating layers. A terminating portion of the source electrode also contacts (a) the termination area through at least one opening in the insulating layers and (b) the peripheral polycrystalline segment through an opening in the second insulating layer. The combination of the source-electrode terminating portion, the peripheral polycrystalline segment, and a field ring that runs along the peripheral polycrystalline segment below the first insulating layer constitutes a field plate that improves MOSFET performance by preventing undesirably high electric fields from occurring.

In another aspect of the invention, a pair of laterally separated polycrystalline semiconductor segments are situated on the first insulating layer over the termination area. The second insulating layer overlies the two polycrystalline segments. As in the first aspect of the invention, the source electrode contacts (a) the active area through multiple openings in the insulating layers, (b) the termination area through at least one opening in the insulating layers, and (c) one of the polycrystalline segments through an opening in the second insulating layer.

The other polycrystalline segment extends over a scribe-line section of the termination area where the semiconductor body is cut into separate dice. Importantly, the termination structure includes a special metallic portion that contacts this second polycrystalline segment through an opening in the second insulating layer. During the dicing procedure, the second polycrystalline segment and the overlying special metallic portion are electrically shorted to the semiconductor body. This allows the special metallic portion, in combination with the second polycrystalline segment, to equalize the potential at the outer periphery of the MOSFET and thereby reduces the likelihood of malfunction.

In the first two aspects of the invention, a main polycrystalline semiconductor portion overlies the first insulating layer largely over the active area and contacts a gate electrode for the MOSFET through an opening in the second insulating layer. A third aspect of the invention deals with the structure centering around the main polycrystalline portion, the special metallic portion, and the polycrystalline segment that underlies the special metallic portion. This structure is useful in a wide variety of MOSFET applications, including trench-isolated devices.

The invention provides a streamlined process for manufacturing the present MOSFET structure. An important feature of the fabrication process centers around the procedure used to divide a non-monocrystalline semiconductor layer into sections corresponding to the polycrystalline portion and segments described above. Initially, the non-monocrystalline layer is deposited on the first insulating layer. The non-monocrystalline layer is then patterned to create a main non-monocrystalline portion and a peripheral non-monocrystalline portion. The main non-monocrystalline portion, which corresponds to the above-mentioned main polycrystalline portion, largely lies over the active area. The peripheral non-monocrystalline portion lies over the termination area.

A second insulating layer is formed over the non-monocrystalline portions. A metallic layer is deposited and patterned to create the source and gate electrodes and, optionally, the special metallic portion. An etching step, commonly referred to as a defreckle etch, is then performed to divide the peripheral polycrystalline portion into first and second non-monocrystalline segments corresponding to the first and second peripheral polycrystalline segments.

The non-monocrystalline layer preferably consists of silicon deposited in polycrystalline form. However, the non-monocrystalline layer could be deposited in amorphous form. In the latter case, the normal heating operations present during the MOSFET fabrication process transform the amorphous silicon into polysilicon.

Only four masking steps are needed to fabricate the various layers and regions described above. A final passivation masking step brings the total number of masking steps up to the very small number of five. As a result, the fabrication process of the invention is very efficient.

BRIEF DESCRIPTION OF THE DRAWINGS

FIG. 2M is taken through plane 2M—2M in FIGS. 4A and 4B.

FIG. 7B is taken through plane 7B—7B in FIG. 9.

Like reference symbols are used in the drawings and in the description of the preferred embodiments to represent the same or very similar item or items.

DESCRIPTION OF THE PREFERRED EMBODIMENTS

In accordance with the teachings of the present invention, a vertical N-channel power double-diffused MOSFET ("DMOSFET") is fabricated by a process that requires only five masking steps. The DMOSFET device consists of a group of DMOSFET cells laterally surrounded by a termination structure. FIGS. 2A–2M show various stages in the fabrication of one of the outer DMOSFET cells along with the termination structure.

Figure 2A:
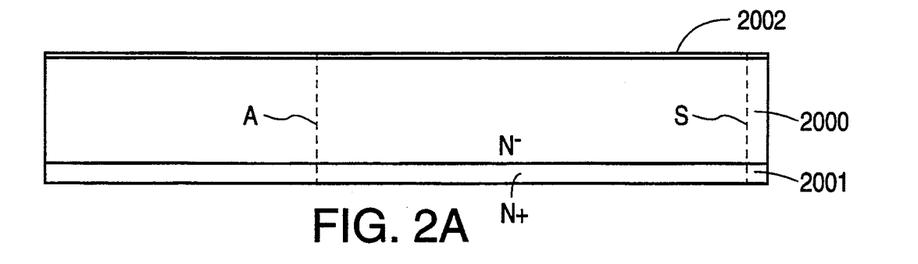
FIGS. 2A, 2B, 2C, 2D, 2E, 2F, 2G, 2H, 2I, 2J, 2K, 2L, and 2M are cross-sectional structural views representing stages in the fabrication of a N-channel power MOSFET device and an associated termination structure in accordance with the invention.

Fabrication of the DMOSFET device begins with deposition of a lightly doped N-type silicon epitaxial layer 2000 on a heavily doped N-type monocrystalline silicon substrate 2001 as shown in FIG. 2A. N−epitaxial layer 2000 is 5–20 $\mu$m thick and has a doping concentration of 4E15–4E16 atoms/cm$^3$. N+substrate 2001 has a doping concentration of 2E19–8E19 atoms/cm$^3$. Although substrate 2001 is actually about 500 $\mu$m in thickness, substrate 2001 is represented here in condensed fashion to facilitate the illustration.

The semiconductor body formed by substrate 2000 and epitaxial layer 2001 consists of (a) a main active area in which the DMOSFET cells are formed and (b) a peripheral termination area which laterally encloses the active area. Dashed line A in the drawings marks the division between the active and termination areas, with the active area lying to the left and the termination area lying to the right. A scribe-line section of the termination area lies to the right of dashed line S in the drawings.

A thin electrically insulating gate layer 2002 of silicon dioxide is thermally grown along the entire upper surface of epitaxial layer 2000 to a substantially uniform thickness. Again, see FIG. 2A. Gate oxide 2002 is 100–1000 angstroms thick.

A layer of polycrystalline silicon ("polysilicon") is deposited on thin oxide 2002 to a thickness of 4000–5000 angstroms. In a first masking step, the polysilicon layer is patterned by removing certain portions with an anisotropic etchant, thereby leaving polysilicon portions 2003A, 2003B, and 2003C, and also exposing selected portions of underlying thin oxide 2002. See FIG. 2B. Polysilicon portions 2003A and 2003B join together outside the plane of FIG. 2B to form a single main polysilicon portion situated largely over the active area. Peripheral polysilicon portion 2003C overlies the termination area and is laterally configured in the shape of a ring extending around main polysilicon portion 2003A/2003B.

Figure 2B:
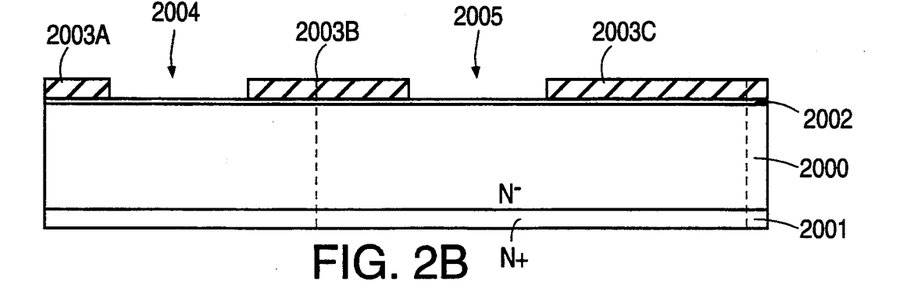

As a result of the etching step, an opening 2004 is formed through the polysilicon over part of the active area where an outer DMOSFET cell will be formed. Many other such openings 2004 outside the plane of FIG. 2B are formed through the polysilicon over other parts of the active area where other DMOSFET cells will be formed. An annular opening 2005 is also formed through the polysilicon over the termination area.

Figure 2C:
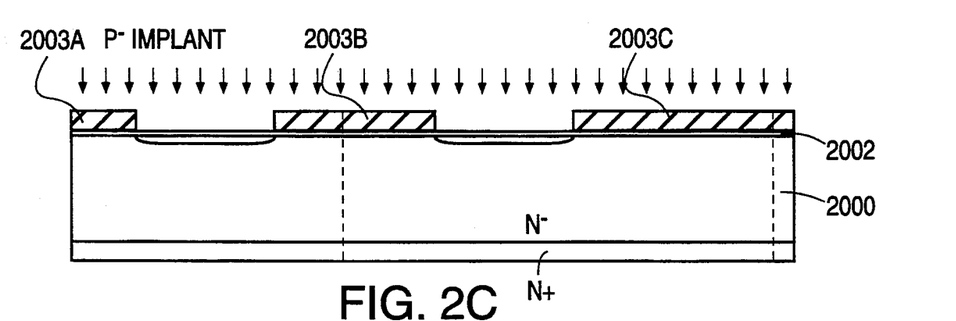

As shown in FIG. 2C, a light P-type body ion implant is performed through thin oxide 2002 into epitaxial layer 2000 at openings 2004 and 2005. Remaining polysilicon portions 2003A/2003B and 2003C act as an implant mask. This implant is typically done with boron (in the form of B+) at an energy of 40–50 KeV and a dose of 1E13–3E14 ions/cm$^2$.

The implanted boron is driven deeper into epitaxial layer 2000 in a heating operation referred to as the body diffusion. See FIG. 2D. The body diffusion is performed at 1050°–1200° C. for 5–120 minutes until the boron has diffused 0.5–2.0 $\mu$m down into epitaxial layer 2000. The implanted boron also diffuses laterally 0.4–1.6 $\mu$m below parts of polysilicon portions 2003A–2003C. The boron therefore forms a P−body region 2006 and a P−ring region 2007. Other such P−body regions 2006 are simultaneously formed below openings 2004 outside the plane of FIG. 2D. Ring region 2007 laterally surrounds the entire active area of the semiconductor body.

Figure 2D:
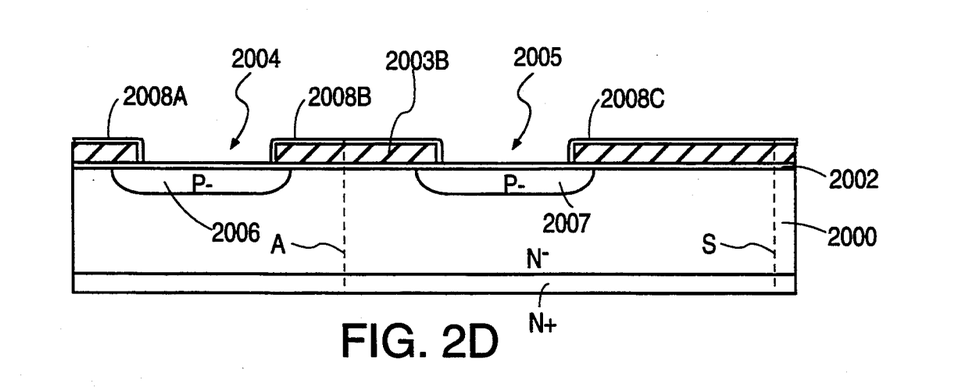

Alternatively, a group of laterally separated P-regions can be formed in epitaxial layer 2000 for a group of inactive cells. Such inactive cells are situated in an annular row between the active cells and polysilicon ring 2003C.

An oxidizing ambient is used during part of the body diffusion. As a result, layers 2008A, 2008B, and 2008C of silicon dioxide are formed on the exposed top and side surfaces of polysilicon portions 2003A–2003C during the body diffusion, regardless of whether the structure utilizes ring region 2007 or laterally separated P-regions for inactive cells. Oxide layers 2008A and 2008B join together outside the plane of FIG. 2E.

Figure 2E:
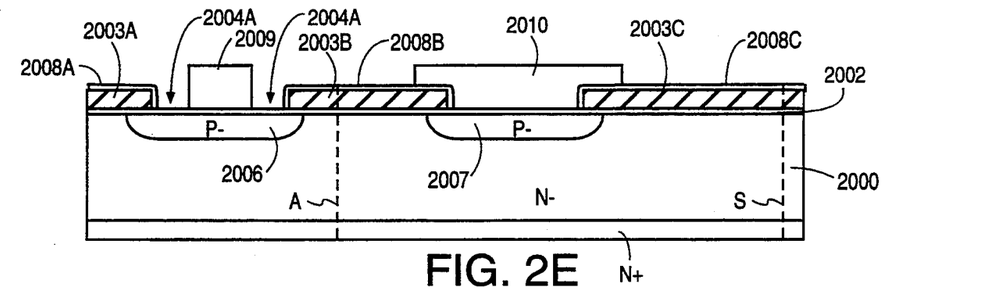

As shown in FIG. 2E, a layer of positive photoresist is provided and subsequently developed in a second masking step to form local blocking areas of photoresist. This photoresist is typically 1.5 μm thick. In the active area, a block 2009 of photoresist is thereby formed in part of each of openings 2004 through which the light P-type body implant was previously made. The remainder of each opening 2004 thereby constitutes an annular portion 2004A. In the termination area, a block 2010 of photoresist is formed to completely cover opening 2005 in the polysilicon. Photoresist block 2010 also extends beyond the lateral boundary of opening 2005 over at least a portion of polysilicon portions 2003B and 2003C so that any misalignment of the photoresist mask to the left or right in FIG. 2E does not result in any part of P−ring region 2007 being exposed.

Figure 2F:
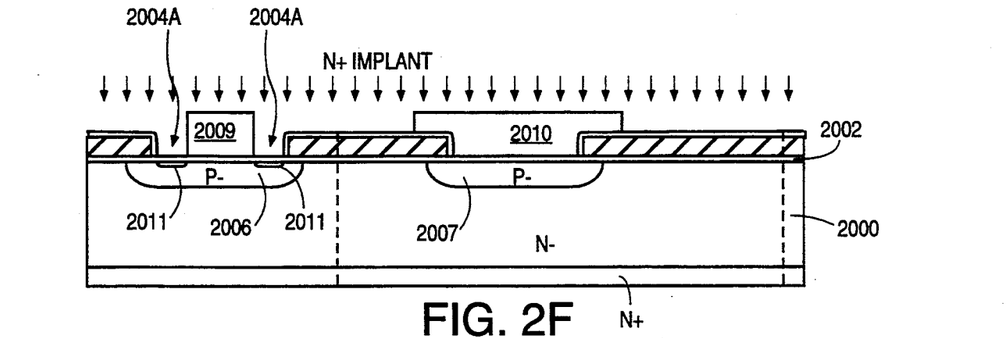

A subsequent heavy N-type source implant is performed as shown in FIG. 2F. This implant step is typically done with arsenic (in the form of As$^+$) at an energy of 80–150 KeV and a dose of 5E15–8E15 ions/cm$^2$. N+regions 2011 are thereby formed below annular openings 2004A around photoresist blocks 2009 in the active area. Each N+region 2011 has an annular shape as viewed from the top. The outer and/or inner boundary of this annular shape may be a polygon such as a hexagon, a square, an octagon, or a long strip-like rectangular shape. The inner and outer boundaries of annular N+regions 2011 may have different geometrical shapes when viewed from the top. No N+region is formed below opening 2005 in the termination region due to photoresist block 2010 covering the entire surface of oxide 2002 in opening 2005.

Figure 2G:
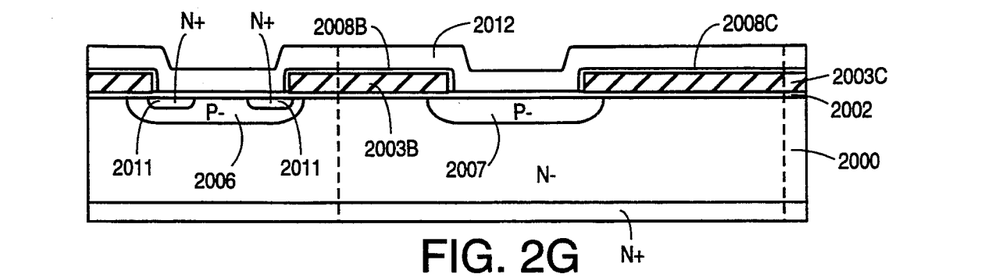

Photoresist blocks 2009 and 2010 are subsequently removed. N+regions 2011 are driven further into P−regions 2006 in the active area in a heating operation referred to as the source diffusion. See FIG. 26. The source diffusion is performed at 900°–1000° C. for 30–60 minutes in an oxidizing ambient until regions 2011 have diffused downward 0.3–0.7 μm.

After the source diffusion, a layer 2012 of borophosphosilicate glass ("BPSG") is deposited and flowed over the structure as depicted in FIG. 2G. BPSG layer 2012 is 1.2–1.4 μm thick.

For shallow junction applications (0.1–0.3 μm), the source diffusion can be omitted. N+regions 2011 substantially remain at the locations indicated by N+region 2011 in FIG. 2F. The arsenic in N+regions 2011 is activated during the BPSG flow.

A third masking step is performed to create openings 2013A, 2013B, 2013C, 2013D, and 2013E in BPSG layer 2012, thereby leaving BPSG portions 2012A, 2012B, 2012C, 2012D, 2012E, and 2012F. See FIG. 2H. Many other such openings 2013A are formed through BPSG layer 2012 in the active area outside the plane of FIG. 2H. Likewise, there are many other such openings 2013B outside the plane of FIG. 2H.

Figure 2H:
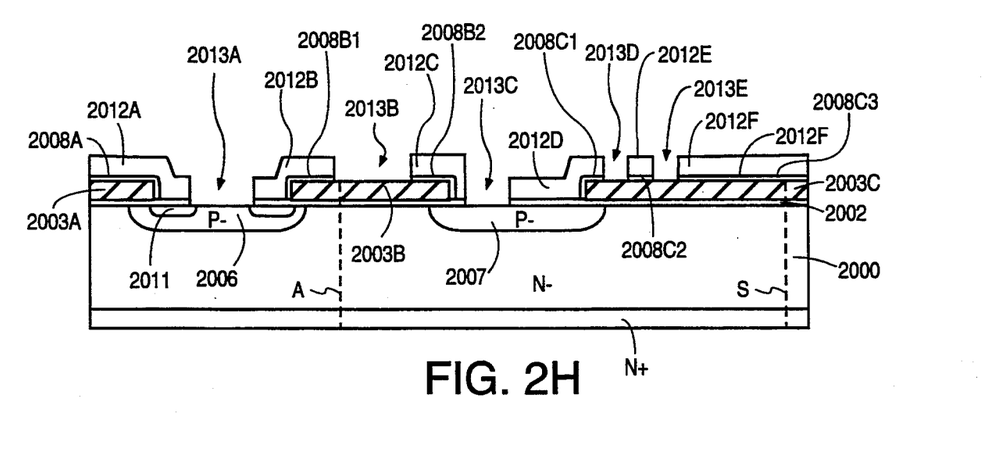

BPSG portions 2012A–2012C join together outside the plane of FIG. 2H. Each of openings 2013C–2013E is an annular opening that encircles the active area. Consequently, BSPG portions 2012D–2012F are annular regions laterally separated from one other and from composite BPSG portion 2012A/2012B/2012C.

Each opening 2013A lies over a portion of the surface area previously covered by one of photoresist blocks 2009 so that only an inside annular portion of underlying annular N+region 2011 is exposed. Opening 2013C lies over a portion of the surface area previously covered by photoresist block 2010 so that BPSG region 2012D extends over a portion of oxide layer 2002 inside opening 2005 and also up and over a part of polysilicon region 2003C. Openings 2013A and 2013C extend through BPSG layer 2012 and underlying gate oxide layer 2002 down to the top of epitaxial layer 2000.

Each opening 2013B extends through both BPSG layer 2012 and oxide layer 2008B down to the top of polysilicon portion 2003B. Layer 2008B is divided into oxide portions 2008B1 and 2008B2 that join together outside the plane of FIG. 2H.

Openings 2013D and 2013E extend through BPSG layer 2012 and oxide layer 2008C down to the top of polysilicon portion 2003C in the termination area. In this way, openings 2013D and 2013E expose two separate portions of a selected area of polysilicon portion 2003C. Because openings 2013D and 2013E are annular openings, layer 2008C is divided into annular oxide portions 2008C1, 2008C2, and 2008C3 laterally separated from one other.

Figure 2I:
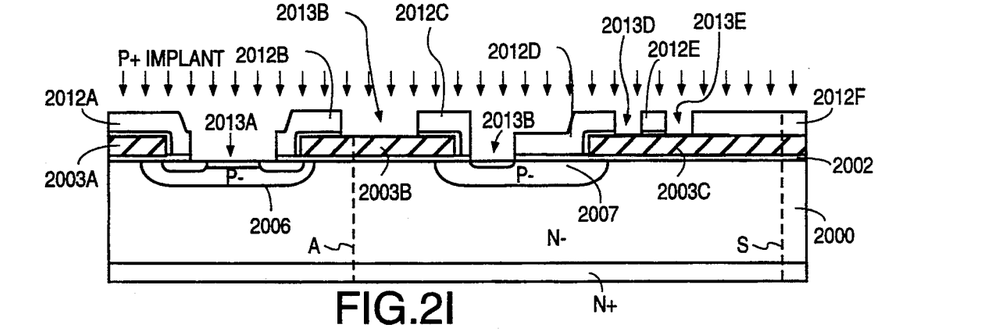

As indicated in FIG. 2I, a heavy P-type ion implant is performed to introduce further P-type dopant into part of each P−region 2006 of the active area and into part of P−ring 2007 of the termination area. This implant is typically done with boron (in the form of B$^+$) at 40–60 KeV and 1E14–1E15 ions/cm$^2$. The implant provides better surface contact to subsequently added metal electrodes.

The implanted boron is driven further into P−regions 2006 and 2007 in a heating operation referred to as the body contact diffusion. A P+body contact zone 2014A is thereby formed in each body region 2006, and an annular P+termination contact zone 2014B is created in ring region 2007. See FIG. 2J.

Figure 2J:
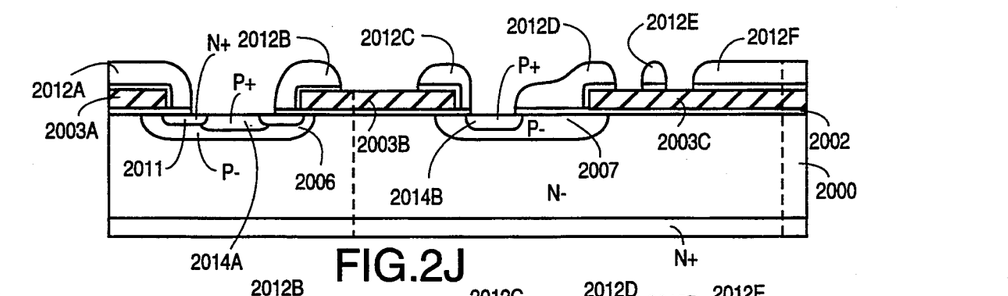

The body contact diffusion is performed at 900°–950° C. for 30–60 minutes in an oxidizing or inert ambient. BPSG 2012 is simultaneously reflowed to remove abrupt BPSG edges created when openings 2013A–2013E were formed in BPSG 2012. This reflow allows better metal step coverage in the final structure. A rapid thermal annealing step may also be used to cause the implanted boron to diffuse further into regions 2006 and 2007.

A layer 2015 of metal such as 2–4 μm of aluminum is sputtered over the top of the structure to extend down into openings 2013A–2013E in BPSG layer 2012. See FIG. 2K. Accordingly, metal layer 2015 contacts P+zones 2014A and 2014B through openings 2013A and 2013C. Metal layer 2015 contacts polysilicon portion 2003B through opening 2013B. Metal layer 2015 also contacts polysilicon portion 2003C in the termination area at two selected places through openings 2013D and 2013E.

Figure 2K:
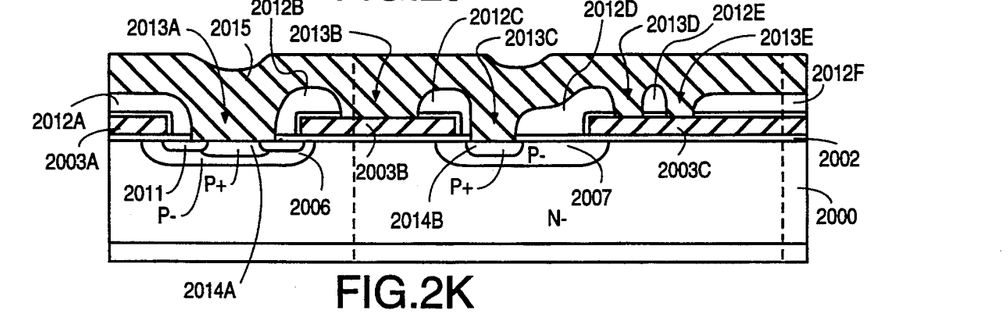
Figure 2L:
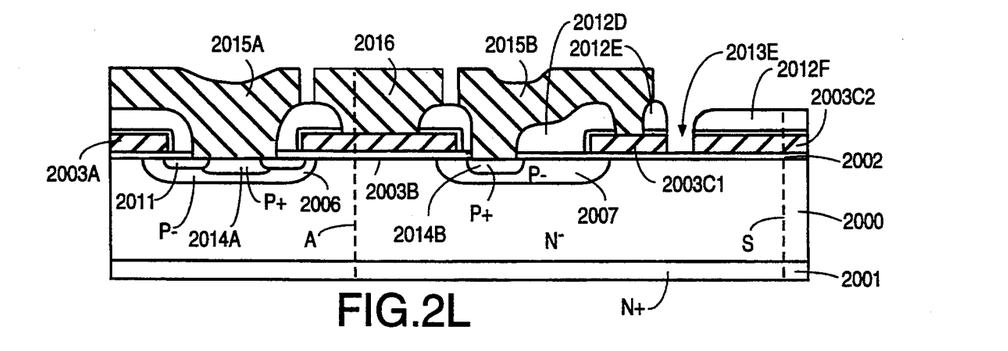

As shown in FIG. 2L, a fourth masking step is performed for removing selected portions of metal layer 2015 in a wet etch to form source metal electrode 2015A, metal gate finger electrode 2016, and termination metal 2015B. Note, as indicated below, that electrodes 2015A and 2015B are continuous with each other and thereby form a composite source electrode. During this step, the metal in opening 2013E is etched away to expose the top surface of peripheral polysilicon portion 2003C at the bottom of opening 2013E. Because metal layer 2015 usually contains small amounts of silicon, silicon residue remains after the wet metal etch step.

In the present invention, a defreckle etch is now performed to remove silicon residue left after the wet metal etch and, importantly, to create an opening through the part of polysilicon portion 2003C exposed by opening 2013E in BPSG layer 2012. As a result, opening 2013E is extended down to the top of thin oxide layer 2002 overlying epitaxial layer 2000. An annular first polysilicon segment 2003C1 and an annular second polysilicon segment 2003C2 are thereby created from original polysilicon ring 2003C. Polysilicon segment 2003C2 extends over the scribe-line section of the termination area as indicated in FIG. 2L.

After the metal and defreckle etches, a passivation layer 2018 is deposited over the entire upper surface of the structure. See FIG. 2M. A fifth and final masking step is performed to create openings through passivation layer 2018 to reach down to a metal gate pad and a metal source pad. These gate and source pads are situated outside the plane of FIG. 2M.

Figure 2M:
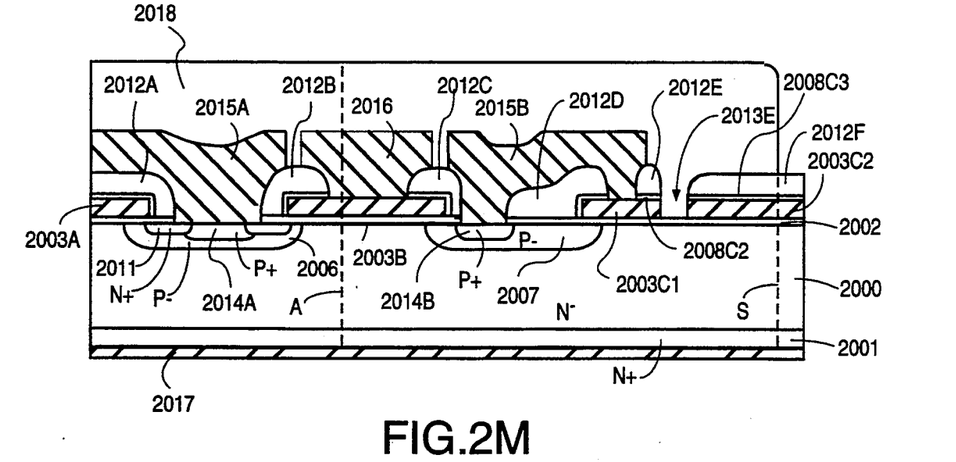

The bottom surface of substrate 2001 is then backlapped (ground down) until the structure has a thickness of 350–450 $\mu$m. A metal drain 2017 is sputtered onto the ground bottom surface of N+silicon substrate 2001. FIG. 2M shows the resulting structure.

In FIG. 2M, annular BPSG portion 2012E and underlying thin oxide portion 2008C2 separate termination metal portion 2015B from polysilicon segment 2003C1 along the inside edge (left-hand edge in FIG. 2M) of opening 2013E. Alternatively, BPSG portion 2012E and oxide portion 2008C2 could be eliminated so that termination metal 2015B extends to the outer periphery of polysilicon segment 2003C1.

Figure 3:
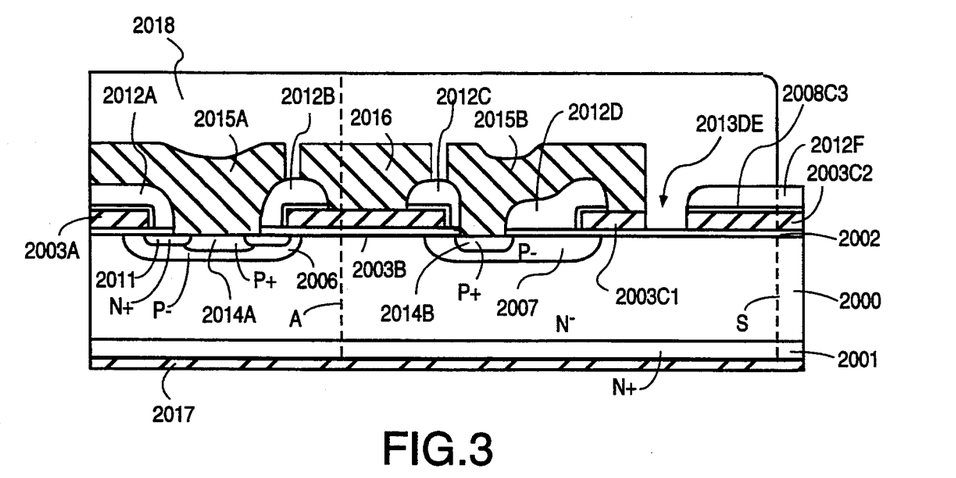
FIG. 3 is a cross-sectional structural view of a variation of the structure in FIG. 2M.

FIG. 3 illustrates a completed example of such an alternative in which termination metal portion 2015B and polysilicon segment 2003C2 meet along their outer boundaries. The structure in FIG. 3 is created by modifying the photoresist mask used in the BPSG etch of the structure in FIG. 2H so as to merge openings 2013D and 2013E into a single opening 2013DE. During the later defreckle etch, an annular part of opening 2013DE is extended through polysilicon portion 2003C to divide it into polysilicon segments 2003C1 and 2003C2 in such a way that termination metal 2015B extends up to opening 2013DE. Deposition and patterning of passivation layer 2018 thereby leads to the structure shown in FIG. 3.

Figure 4A:
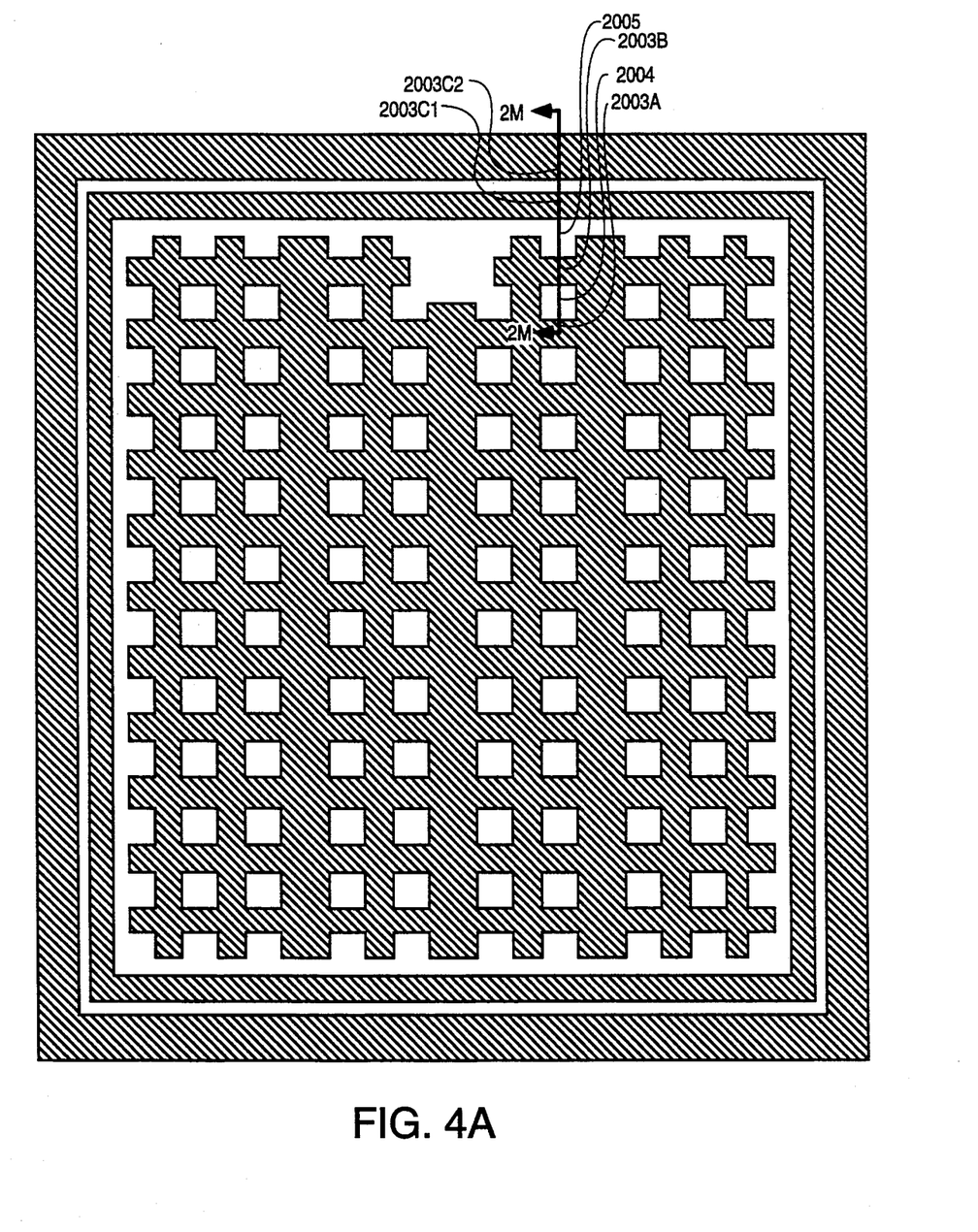
FIGS. 4A and 4B are plan views for respective configurations of the polysilicon and metal layers in the structure of FIG. 2M.

FIG. 4A depicts one possible layout of the patterned polysilicon layer of the present invention. This particular polysilicon layout, with a relatively small number of openings 2004 in the active area, is provided for explanatory purposes. Other polysilicon configurations are possible.

Figure 4B:
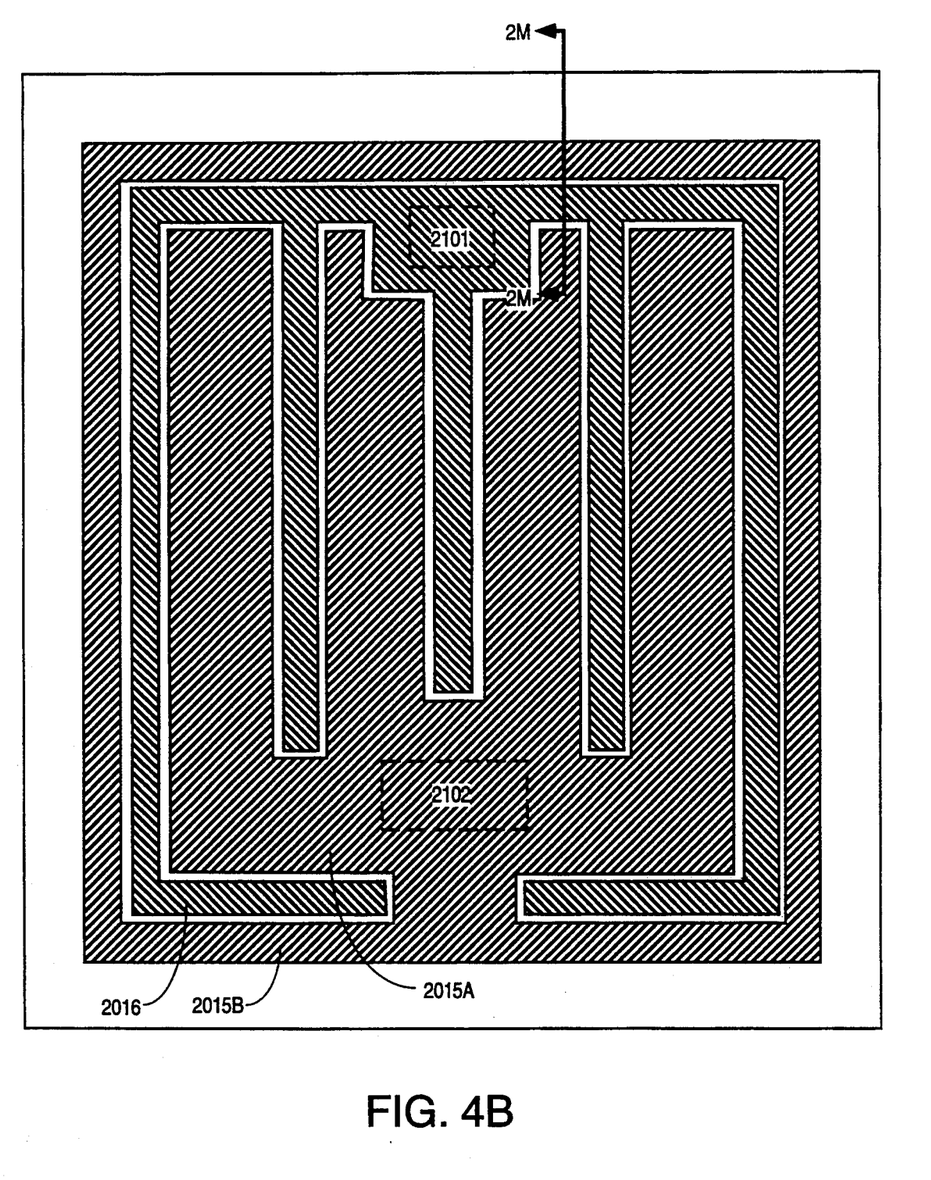

FIG. 4B depicts a metal layout for gate finger electrode 2016 and composite source electrode 2015A/2015B corresponding to the polysilicon layout of FIG. 4A. Rectangular pad 2101 in FIG. 4B indicates the overlying metal gate pad. Rectangular pad 2102 indicates the overlying metal source pad.

High-voltage DMOSFET devices must be able to survive conditions of high reverse bias. Under reverse bias, the PN junction formed between the P body region of each active cell and the N material of the epitaxial layer depletes. As the PN junction depletes more and more at progressively higher reverse bias, the depletion region extends further and further away from the junction. If the depletion region has a smooth and continuous surface, a substantially constant electric field will be present throughout the surface of the depletion region. If, on the other hand, the depletion region has a nonuniform surface, localized areas of higher electric field will be present. Accordingly, the silicon in the depletion region will break down first in these localized areas of higher electric fields. Field plates are therefore used in termination areas to influence the electric fields in the underlying substrate so that the contours of the surface of the depletion region are smoother and so that the reverse bias voltage at which the device breaks down is higher.

In the above embodiment, polysilicon segment 2003C1 is electrically connected to P+ring 2014B by way of termination metal portion 2015B. P−ring 2007, P+ring 2014B, metal portion 2015B, and polysilicon segment 2003C1 form a termination field plate. Polysilicon segment 2003C1 of the field plate is insulated from the underlying epitaxial layer by thin oxide layer 2002. Under high reverse bias, the depletion region forms along the upper surface of epitaxial layer 2000 due to the influence of overlying polysilicon segment 2003C1.

Figure 5:
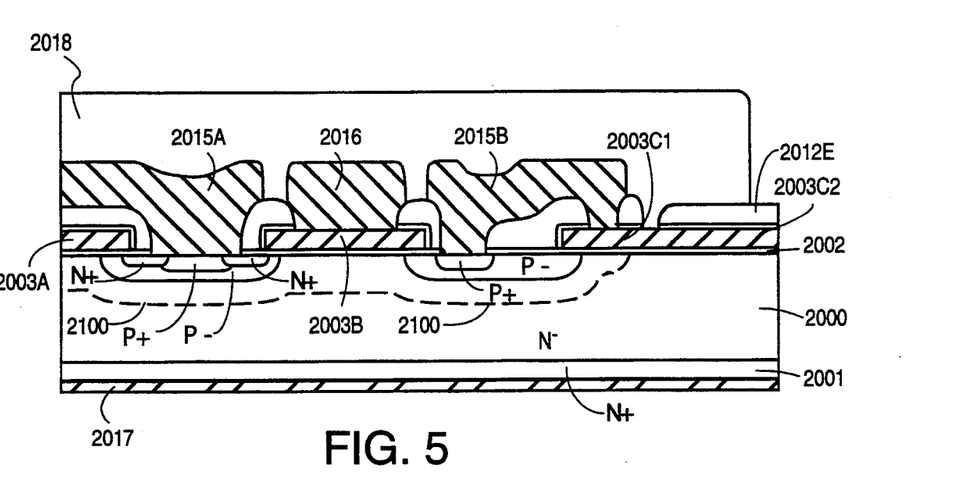
FIG. 5 is a cross-sectional structural view for the outer contour of the depletion region in a termination structure of the present invention with a field plate in a reverse biased condition.
Figure 6:
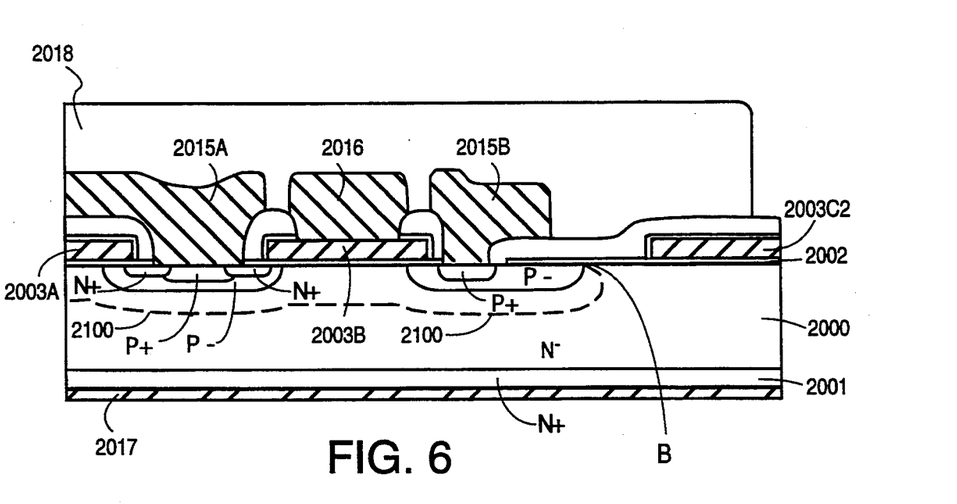
FIG. 6 is a cross-sectional structural view for the outer contour of the depletion region in a termination structure wherein a field plate is not used.

FIG. 5 shows the outline of outer contour 2100 of the depletion region in conditions of high reverse bias, where the voltage between the drain and the source is approximately 20 volts, and where the voltage between the gate and source is approximately 20 volts. FIG. 6 shows what the outer contour of the depletion region 2100 would be at approximately the same conditions of high reverse bias if polysilicon ring 2003C1 were not present. The area of localized high electric field at which the device of FIG. 5 would most likely break down is point B in FIG. 6 where P−ring 2007 reaches the top of epitaxial layer 2000 along thin oxide layer 2002. In FIG. 5, polysilicon field ring 2003C1 smoothes out the contour of the depletion region to eliminate the relatively sharp discontinuity of the depletion region at point B.

The breakdown voltage of the resulting vertical DMOSFET device can be measured between composite source electrode 2015A/2015B and drain electrode 2017. When a large negative voltage is placed across the device, a negative voltage is present between termination metal 2015B (which is electrically connected to source metal 2015A outside the plane of FIG. 5) and drain metal 2017 on the bottom of substrate 2001. Because both oxide layer 2002 and the underlying depletion region have capacitances, the large negative voltage across the device is dropped in part across oxide layer 2002 below polysilicon segment 2003C1 and in part across the depletion region in the underlying silicon. Oxide layer 2002 therefore need not necessarily be able to withstand the full negative voltage in order not to breakdown and in order to perform its function satisfactorily.

In the foregoing process, oxide layer 2002 is typically 500 angstroms thick and undergoes dielectric breakdown when approximately 35 volts is across layer 2002. The breakdown voltage of the vertical DMOSFET device is approximately 40 volts. In embodiments where the dielectric breakdown requirements on oxide 2002 can be met with a relatively thin oxide layer, the above described embodiment of this five-step process is particularly advantageous.

In the final structure shown in FIG. 2M, polysilicon ring 2003C2 in the termination area is used in part to mask the underlying surface of epitaxial layer 2000 in the scribe-line section of the termination area. If the scribe-line section of the termination area were not masked, the scribe-line section of epitaxial layer 2000 could be doped with P-type dopant during the P-type implant step of FIG. 2I. A parasitic NPNP silicon controlled rectifier would be formed from N+region 2011 in the active area to P−region 2006 in the active area, to N− epitaxial layer 2000, and to a P+region in the scribe-line section of the termination area. In the present invention, polysilicon ring 2003C2 is used in part to prevent a P+region from being formed in the epitaxial part of the scribe-line region.

During the sawing apart of dice at the scribe-line region, polysilicon ring 2003C2 becomes electrically shorted to underlying epitaxial layer 2000. This connection is useful because it prevents a charge from developing on polysilicon ring 2003C2 and therefore prevents a depletion region from forming below polysilicon ring 2003C2 at the scribe line. Opening 2013E isolates polysilicon field-plate ring 2003C1 from outer polysilicon ring 2003C2 so as to prevent the connection between polysilicon ring 2003C2 and epitaxial layer 2000 from impairing the performance of the active MOSFET cells.

In an alternative implementation of the foregoing process, an special metal portion is provided on the termination area outside of termination metal 2015B. The initial steps in this alternative implementation are the same as in the first-described implementation up through the stage shown in FIG. 2K except that the photoresist mask used in the BPSG etch of FIG. 2H is modified to enable an additional annular opening to be created through BPSG layer 2012 and underlying oxide layer 2008C outside of annular opening 2013E at the desired location for the additional metal section.

Figure 7A:
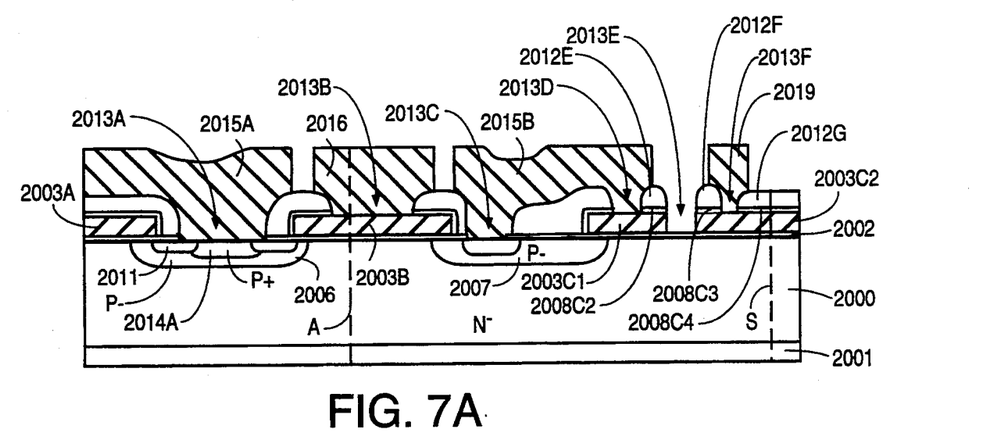
FIGS. 7A and 7B are cross-sectional structural views representing stages in an alternative method for completing the fabrication of a power MOSFET starting from a structure similar to that of FIG. 2K but with an additional annular opening being provided through the outer BPSG portion and the underlying oxide in the termination area.
Figure 7B:
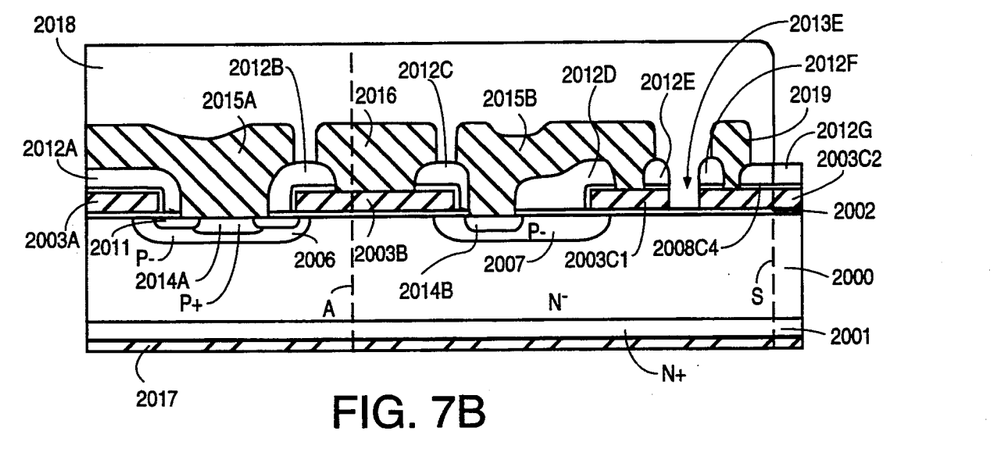

FIGS. 7A and 7B illustrate the remaining steps in the alternative implementation. Item 2013F in FIGS. 7A and 7B indicates the additional annular opening created through BPSG layer 2012 and oxide layer 2008C during the BPSG etch. BPSG portion 2012F of FIG. 2H thereby becomes laterally separated annular BPSG portions 2012F and 2012G in the alternative implementation. Likewise, underlying oxide portion 2008C3 of FIG. 2H becomes laterally separated oxide portions 2008C3 and 2008C4.

FIG. 7A shows the metal etch during the fourth masking step in the alternative implementation. In this masking step, metal layer 2015 of FIG. 2K is selectively etched to form source metal electrode 2015A, gate finger metal electrode 2016, termination metal 2015B, and a special additional metal portion 2019. During the subsequent defreckle etch, opening 2013E is extended through polysilicon portion 2003C to divide it into segments 2003C1 and 2003C2 in the way described above. As shown in FIG. 7A, additional metal portion 2019 contacts polysilicon portion 2003C2 in the termination area but does not extend over the scribe-line section.

Passivation layer 2018 is then applied over the top of the structure as shown in FIG. 7B. The combination of passivation layer 2018, BPSG portion 2012G, and oxide portion 2008C4 laterally surrounds metal portion 2019 along its outer boundary.

The bottom of substrate 2001 is backlapped after which metal drain electrode 2017 is formed on the bottom of substrate 2001. See FIG. 7B. A pad masking step is performed outside the plane of FIG. 7B to form openings through passivation layer 2018 to expose gate and source pads 2101 and 2102 of FIG. 4B.

The electrical conductance of additional metal portion 2019 is considerably higher than that of polysilicon portion 2003C2. When polysilicon ring 2003C2 becomes electrically shorted to epitaxial layer 2000 during die scribing, metal portion 2019 helps ensure that the same potential is maintained around the outer periphery of the termination area along ring 2003C2.

As with the conversion of the structure of FIG. 2M into that of FIG. 3, annular BPSG portion 2012E and underlying oxide portion 2008C2 can be eliminated in the structure of FIG. 7B. Termination metal 2015B and polysilicon segment 2003C thereby meet along their outer peripheries. Likewise, annular BPSG portion 2012F and underlying oxide portion 2008C3 can be eliminated in the structure of FIG. 7B so that protective metal 2019 extends to the inner boundary of polysilicon segment 2003C2.

Figure 8:
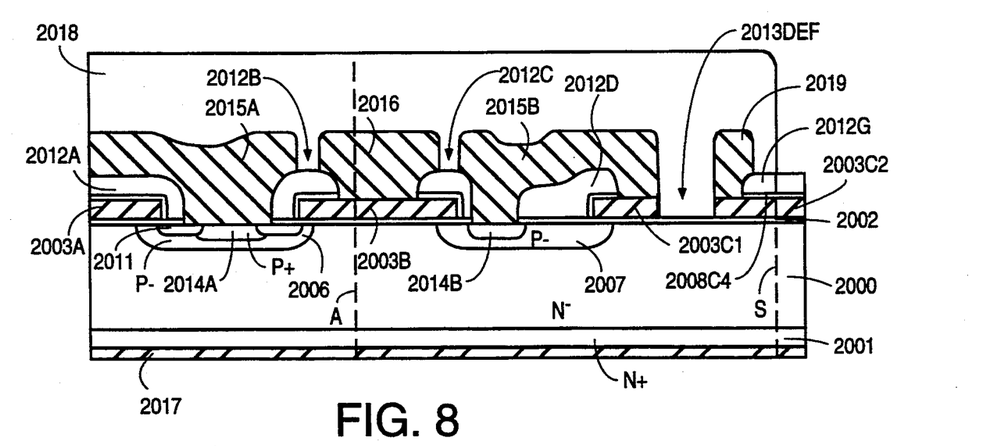
FIG. 8 is a cross-sectional structural view of a variation of the structure in FIG. 7B.

FIG. 8 depicts an example of the structure in FIG. 7B in which BPSG portions 2012E and 2012F and underlying oxide portions 2008C2 and 2008C3 have all been eliminated. The structure in FIG. 8 is created by further modifying the photoresist employed in the BPSG etch of FIG. 2H to merge openings 2013D-2013F into a single opening 2013DEF. During the defreckle etch, an annular part of opening 2013DEF is extended through polysilicon portion 2003C in such a way that termination metal 2015B and polysilicon portion 2003C1 meet along their outer boundaries. Additional metal 2019 and polysilicon portion 2003C2 similarly meet along their inner boundaries. Deposition and patterning of passivation layer 2018 yields the structure of FIG. 8.

Figure 9:
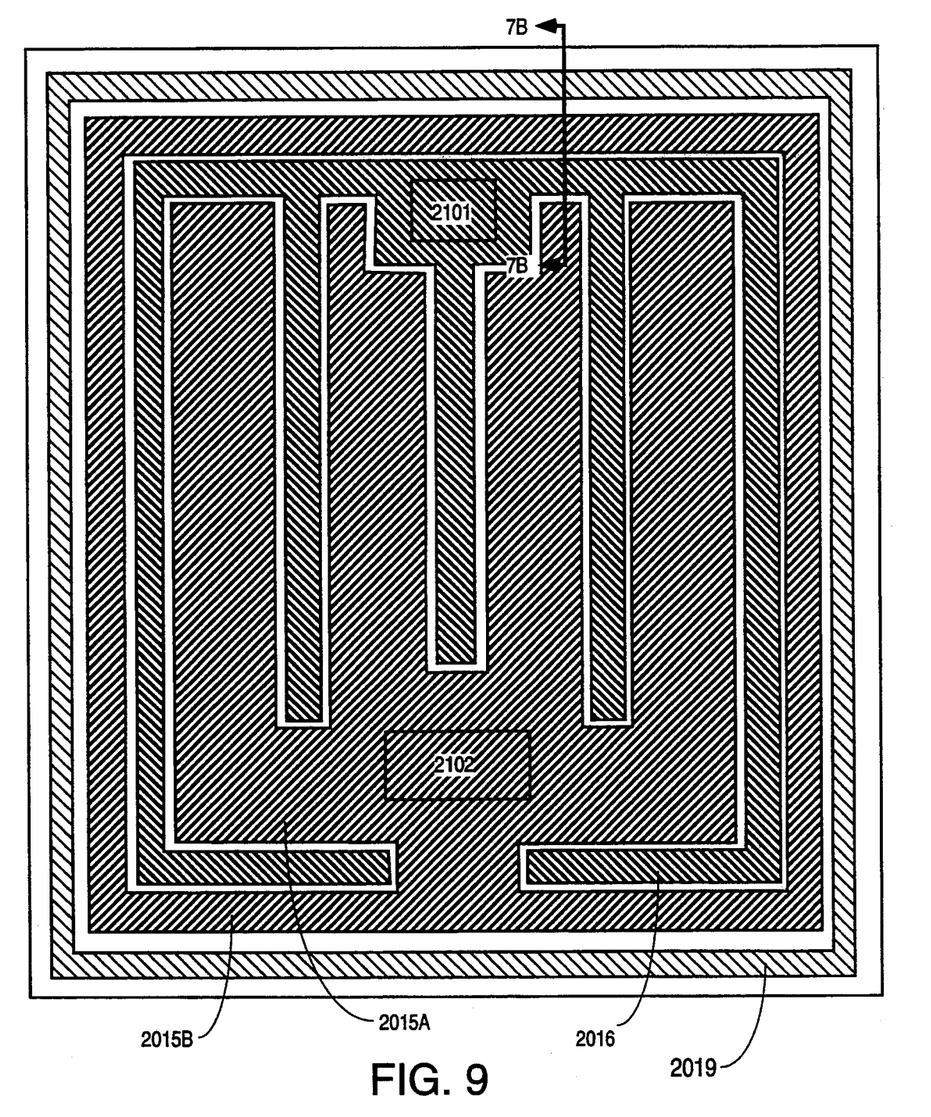
FIG. 9 is a plan view for a configuration of the metal layer in FIG. 7B.

FIG. 9 is a possible layout of the patterned polysilicon layer for the structure of FIG. 7B. FIG. 9 depicts a corresponding metal layout for gate electrode 2016, composite source electrode 2015A/2015B, and metal portion 2019. As indicated in FIG. 9, metal portion 2019 constitutes a strip that laterally surrounds electrodes 2016 and 2015A/2015B.

The termination structures of the present invention can be utilized in power MOSFETs that employ trench isolation. Suitable examples of such trench-isolated power MOSFETs are described in U.S. patent applications Ser. Nos. 7/918,996 and 7/928,909 respectively filed 23 Jul. 1992 and 12 Aug. 1992. The contents of these two applications are incorporated by reference herein. Termination structures that contain peripheral metal portions such as special metal portion 2019 in FIGS. 7B and 8 are particularly appropriate for the trench-isolated power MOSFETs of Ser. Nos. 7/918,996 and 7/928,909.

While the invention has been described with reference to particular embodiments, this is solely for the purpose of illustration and is not to be construed as limiting the scope of the invention claimed below. For example, the N-channel DMOSFET process can be modified to implement a P-channel vertical DMOSFET by reversing junction polarities and converting P type dopants to N-type dopants and vice versa. No particular equipment type is critical in the fabrication of the disclosed structures. Other types of semiconductor materials could be used.

The various polysilicon portions could be created from a layer originally deposited in amorphous silicon form. Advantage could then be taken of the fact that the heating cycles during the process are normally adequate to convert the amorphous silicon into polysilicon. In this regard, polysilicon and amorphous silicon constitute types of non-monocrystalline silicon. Various modifications, applications, and improvements can thus be made by those skilled in the art without departing from the true scope and spirit of the invention as described in the appended claims.

We claim:

1. A power MOSFET comprising:
    a monocrystalline semiconductor body having a main active area and a peripheral termination area;
    a plurality of source regions situated in the active area;
    a first insulating layer overlying the active and termination areas;
    a main polycrystalline semiconductor portion situated over the first insulating layer largely above the active area;
    a peripheral polycrystalline semiconductor segment situated over the first insulating layer above the termination area and laterally separated from the main polycrystalline portion;
    a second insulating layer overlying the main polycrystalline portion and the peripheral polycrystalline segment;
    a gate electrode contacting the main polycrystalline portion through at least one opening in the second insulating layer;
    a source electrode contacting the source regions through a plurality of openings in the insulating layers; and
    a metallic portion contacting the peripheral polycrystalline segment through at least one opening in the second insulating layer, the metallic portion being laterally separated from the source and gate electrodes, the peripheral polycrystalline segment extending over a scribe-line section of the termination area so as to be scribed during a scribing operation.

2. A power MOSFET as in claim 1 wherein the second insulating layer also extends over the scribe-line section so as to be scribed during the scribing operation.

3. A power MOSFET as in claim 1 wherein the peripheral polycrystalline segment substantially laterally surrounds the main polycrystalline portion.

4. A power MOSFET as in claim 1 wherein the metallic portion substantially laterally surrounds the source and gate electrodes.

5. A power MOSFET as in claim 1 wherein the metallic portion is vertically spaced apart from the termination area.

6. A method which comprises the following steps for creating a power MOSFET:
    forming a non-monocrystalline semiconductor layer over a first insulating layer along a monocrystalline semiconductor body having a main active area and a peripheral termination area, the semiconductor body being of a first conductivity type;
    patterning the non-monocrystalline layer to form therethrough (a) a plurality of openings situated over the active area and (b) an annular opening situated over the termination area and substantially laterally surrounding the openings over the active area so as to divide the non-monocrystalline layer into (b1) a main non-monocrystalline portion largely overlying the active area and (b2) a laterally separate peripheral non-monocrystalline portion overlying the termination area;
    introducing a dopant of a second conductivity type opposite to the first conductivity type through the openings into the semiconductor body to form (a) a like plurality of body regions of the second conductivity type in the active area and (b) a field plate region of the second conductivity type in the termination area;
    selectively introducing a dopant of the first conductivity type through the plurality of openings over the active area into the semiconductor body, but substantially not through the annular opening over the termination area, to form source regions of the first conductivity type in the body regions;
    forming a second insulating layer over the non-monocrystalline portions and in the openings;
    selectively removing parts of at least the second of the insulating layers to form therethrough (a) a like plurality of further openings down to the source regions, (b) a further opening down to the field plate region, (c) at least one further opening down to the main non-monocrystalline portion, and (d) at least one further opening down to the peripheral non-monocrystalline portion;
    depositing a metallic layer over the second insulating layer and into the further openings;
    patterning the metallic layer to form (a) a gate electrode that contacts the main non-monocrystalline portion and (b) a source electrode that contacts the source regions, the field plate region, and the peripheral non-monocrystalline portion; and
    forming a drain electrode that contacts the semiconductor body.

7. A method as in claim 6 wherein the first insulating layer is of substantially uniform thickness.

8. A method as in claim 7 wherein the thickness of the first insulating layer is 100–1000 angstroms.

9. A method as in claim 6 further including the step of introducing a dopant of the second conductivity type through the further openings to form (a) a like plurality of more heavily doped body contact zones respectively continuous with the body regions and (b) a more heavily doped field plate contact zone continuous with the field plate region.

10. A method as in claim 9 wherein the source electrode contacts the contact zones.

11. A method as in claim 6 further including the step of etching the peripheral non-monocrystalline portion through at least a substantially annular part of a further opening formed through the second insulating layer in order to divide the peripheral non-monocrystalline portion into (a) a first non-monocrystalline segment that contacts the source electrode and substantially laterally surrounds the active area and (b) a laterally separated second non-monocrystalline segment that substantially laterally surrounds the first non-monocrystalline segment.

12. A method as in claim 11 wherein substantially the entire portion of the metallic layer over the second non-monocrystalline segment is removed during the metallic-layer patterning step.

13. A method as in claim 11 wherein an additional portion of the metallic layer is left over at least part of the second non-monocrystalline segment during the metallic-layer patterning step.

14. A method as in claim 13 wherein the additional portion of the metallic layer is formed so as to be vertically spaced apart from the termination area.

15. A method which comprises the following steps for creating a termination structure for a power MOSFET:

forming a first insulating layer along an upper surface of a monocrystalline semiconductor body of a first conductivity type having a main active area and a peripheral termination area;

depositing a non-monocrystalline semiconductor layer over the first insulating layer;

forming an opening at least partway through the non-monocrystalline layer over the termination area;

introducing a dopant of a second conductivity type opposite to the first conductivity type through the opening into the semiconductor body to form a field plate region of the second conductivity type in the termination area;

forming a second insulating layer along the non-monocrystalline layer and over the opening;

selectively removing portions of at least the second of the insulating layers to expose (a) at least one part of the field plate region and (b) at least one part of the non-monocrystalline layer over the termination area;

creating a patterned layer of conductive material over the insulating layers such that a unitary portion of the conductive material contacts both the field plate region and the non-monocrystalline layer over the termination area, an exposed portion of the non-monocrystalline layer over the termination area substantially laterally surrounding both the active area and the unitary portion of the conductive material; and subsequently etching the non-monocrystalline layer at the exposed portion to divide material of the non-monocrystalline layer over the termination area into (a) a first non-monocrystalline segment that contacts the unitary portion of the conductive material and (b) a laterally separated second non-monocrystalline segment that substantially laterally surrounds the first non-monocrystalline segment.

16. A method as in claim 15 wherein the non-monocrystalline and patterned layers respectively consist principally of polysilicon and metal.

17. A method as in claim 15 wherein substantially none of the conductive material overlies the second non-monocrystalline segment at the end of the creating step.

18. A method as in claim 15 wherein an additional portion of the conductive material is left over at least part of the second non-monocrystalline segment at the end of the creating step.

19. A method as in claim 15 wherein the exposed portion of the non-monocrystalline layer is laterally separated from where the unitary portion of the conductive material contacts the non-monocrystalline layer.

20. A method which comprises the following steps for creating a termination structure for a power MOSFET:

forming a first insulating layer along an upper surface of a monocrystalline semiconductor body having a main active area and a peripheral termination area;

depositing a non-monocrystalline semiconductor layer over the first insulating layer;

forming a second insulating layer along the non-monocrystalline layer;

selectively removing material of the second insulating layer to expose at least one part of the non-monocrystalline layer over the termination area;

depositing a conductive layer over the second insulating layer and over exposed material of the non-monocrystalline layer;

patterning the conductive layer to form source and gate electrodes and a laterally separate special conductive portion which (a) substantially laterally surrounds the source and gate electrodes and (b) contacts the non-monocrystalline layer over the termination area, an exposed portion of the non-monocrystalline layer over the termination area substantially laterally surrounding the active area; and etching the non-monocrystalline layer at the exposed portion to divide material of the non-monocrystalline layer over the termination area into a first non-monocrystalline segment and a laterally separate second non-monocrystalline segment that substantially laterally surrounds the first non-monocrystalline segment.

21. A method as in claim 20 wherein the non-monocrystalline and conductive layers respectively consist principally of polysilicon and metal.

22. A method as in claim 20 further including the step of introducing dopants into the active area for creating active MOSFET cells.

23. A method as in claim 20 wherein a portion of the source electrode is formed during the patterning step so as to contact the non-monocrystalline layer over the termination area.

24. A method as in claim 23 wherein the exposed portion of the non-monocrystalline layer is laterally separated from where the source electrode contacts the non-monocrystalline layer.

25. A method as in claim 20 wherein the special portion of the conductive layer is formed so as to be vertically spaced apart from the termination area.

26. A method which comprises the following steps for creating a power MOSFET:

forming a non-monocrystalline semiconductor layer over a first insulating layer along a semiconductor body of a first conductivity type having a main active area and a peripheral termination area;

patterning the non-monocrystalline layer to form (a) a plurality of openings situated over the active area and (b) an opening situated over the termination area and substantially laterally surrounding the openings over the active area so as to divide the non-monocrystalline layer into (b1) a main non-monocrystalline portion largely overlying the active area and (b2) a laterally separate peripheral non-monocrystalline portion overlying the termination area;

introducing a dopant of a second conductivity type opposite to the first conductivity type through the openings into the semiconductor body to form (a) a like plurality of body regions of the second conductivity type in the active area and (b) a field plate region of the second conductivity type in the termination area;

selectively introducing a dopant of the first conductivity type through the plurality of openings over the active area into the semiconductor body, but substantially not through the opening over the termination area, to form source regions of the first conductivity type in the body regions;

forming a second insulating layer over the non-monocrystalline portions and in the openings;

selectively removing portions of at least the second of the insulating layers to expose at least one part of each of the source regions, the field plate region, and the two non-monocrystalline portions; and creating (a) a gate electrode that contacts the main non-monocrystalline portion, (b) a source electrode that contacts the source regions, the field plate region, and the peripheral non-monocrystalline portion, and (c) a drain electrode that contacts the semiconductor body.

27. A method as in claim 26 further including the step of etching the peripheral non-monocrystalline portion through an annular opening formed through the second insulating layer during or after the selectively removing step in order to divide the peripheral non-monocrystalline portion into (a) a first non-monocrystalline segment that contacts the source electrode and substantially laterally surrounds the active area and (b) a laterally separated second non-monocrystalline segment that substantially laterally surrounds the first non-monocrystalline segment.

28. A method as in claim 26 wherein the thickness of the first insulating layer is 100–1000 angstroms.

29. A method as in claim 26 further including the step of introducing a dopant of the second conductivity type through openings created during or after the selectively removing step to form (a) a like plurality of more heavily doped body contact zones respectively continuous with the body regions and (b) a more heavily doped field plate contact zone continuous with the field plate region.

30. A method as in claim 29 wherein the source electrode contacts the contact zones.

31. A method as in claim 26 wherein the creating step comprises:

depositing a conductive layer over the insulating layer so as to contact the source regions, the field plate region, and both non-monocrystalline portions;

patterning the conductive layer to form the gate and source electrodes; and separately forming the drain electrode to contact the semiconductor body at a location spaced apart from the source regions, the field plate region, and the two non-monocrystalline portions.

* * * * *